United States Patent
Hickman et al.

(10) Patent No.: US 7,370,659 B2
(45) Date of Patent: May 13, 2008

(54) PHOTOLITHOGRAPHIC STEPPER AND/OR SCANNER MACHINES INCLUDING CLEANING DEVICES AND METHODS OF CLEANING PHOTOLITHOGRAPHIC STEPPER AND/OR SCANNER MACHINES

(75) Inventors: Craig A. Hickman, Meridian, ID (US); Paul D. Shirley, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 555 days.

(21) Appl. No.: 10/636,132

(22) Filed: Aug. 6, 2003

(65) Prior Publication Data

US 2005/0028314 A1    Feb. 10, 2005

(51) Int. Cl.
*B08B 3/02* (2006.01)
(52) U.S. Cl. ............ 134/104; 134/115 R; 134/166 R; 134/198
(58) Field of Classification Search ............ 134/104.1, 134/902, 115 R, 166 R, 198; 355/72
See application file for complete search history.

(56) References Cited

U.S. PATENT DOCUMENTS

| | | | |
|---|---|---|---|
| 1,978,579 A | | 10/1934 | Hooks |
| 2,221,630 A | | 11/1940 | Bjorkman |
| 4,346,164 A | | 8/1982 | Tabarelli et al. |
| 4,968,375 A | * | 11/1990 | Sato et al. ............. 156/345.23 |
| 5,260,174 A | * | 11/1993 | Nakazawa et al. .......... 430/325 |
| 5,452,053 A | | 9/1995 | Nozue |
| 5,559,582 A | * | 9/1996 | Nishi et al. .................... 355/30 |
| 5,673,208 A | | 9/1997 | Meier et al. |
| 5,698,069 A | * | 12/1997 | Aiyer et al. ............. 356/239.2 |
| 5,825,470 A | * | 10/1998 | Miyai et al. ................... 355/72 |
| 5,828,470 A | | 10/1998 | Maeda et al. |
| 5,871,584 A | | 2/1999 | Tateyama et al. |
| 5,931,722 A | * | 8/1999 | Ohmi et al. ................. 451/271 |
| 6,038,015 A | | 3/2000 | Kawata |
| 6,063,190 A | | 5/2000 | Hasebe et al. |
| 6,266,132 B1 | | 7/2001 | Stewart et al. |

(Continued)

FOREIGN PATENT DOCUMENTS

EP        0 268 284        5/1988

(Continued)

OTHER PUBLICATIONS

U.S. Appl. No. 11/432,153, filed Aug. 6, 2003, Hickman et al.

(Continued)

*Primary Examiner*—Frankie L. Stinson
(74) *Attorney, Agent, or Firm*—Perkins Coie LLP

(57) ABSTRACT

Stepper and/or scanner machines including cleaning devices and methods for cleaning stepper and/or scanner machines are disclosed herein. In one embodiment, a stepper and/or scanner machine includes a housing, an illuminator, a lens, a workpiece support, a cleaning device for removing contaminants from the workpiece support, and a stage carrying the workpiece support. The stage and/or cleaning device is movable to selectively position the workpiece support proximate to the cleaning device. It is emphasized that this Abstract is provided to comply with the rules requiring an abstract. It is submitted with the understanding that it will not be used to interpret or limit the scope or meaning of the claims. 37 C.F.R. § 1.72(b).

22 Claims, 3 Drawing Sheets

U.S. PATENT DOCUMENTS

| | | |
|---|---|---|
| 6,269,517 B1 | 8/2001 | Dornier et al. |
| 6,290,863 B1 * | 9/2001 | Morgan et al. ............... 216/73 |
| 6,459,473 B1 | 10/2002 | Chang et al. |
| 6,466,315 B1 | 10/2002 | Karpol et al. |
| 6,496,257 B1 | 12/2002 | Taniguchi et al. |
| 6,529,274 B1 | 3/2003 | Hickman |
| 6,550,990 B2 | 4/2003 | Sakurai et al. |
| 6,563,568 B2 | 5/2003 | Pierrat |
| 6,624,879 B2 * | 9/2003 | Imai ........................... 355/53 |
| 6,666,927 B2 * | 12/2003 | Gindel ........................ 134/21 |
| 6,682,406 B2 * | 1/2004 | Chiou ......................... 451/56 |
| 6,809,794 B1 | 10/2004 | Sewell |
| 6,817,057 B2 * | 11/2004 | Shirley et al. ................ 15/301 |
| 6,862,080 B2 * | 3/2005 | Matsui ........................ 355/72 |
| 6,867,844 B2 | 3/2005 | Vogel et al. |
| 6,881,264 B2 | 4/2005 | Hiatt et al. |
| 6,970,228 B1 | 11/2005 | Aoki et al. |
| 2003/0200996 A1 * | 10/2003 | Hiatt et al. .................. 134/21 |
| 2004/0118184 A1 | 6/2004 | Violette |
| 2004/0134420 A1 | 7/2004 | Lei |
| 2004/0154530 A1 * | 8/2004 | Hiatt et al. .................. 118/50 |
| 2004/0169924 A1 | 9/2004 | Flagello et al. |
| 2004/0207824 A1 | 10/2004 | Lof et al. |
| 2004/0211920 A1 | 10/2004 | Derksen et al. |
| 2004/0263808 A1 | 12/2004 | Sewell |
| 2005/0024609 A1 | 2/2005 | De Smit et al. |
| 2005/0042554 A1 | 2/2005 | Dierichs et al. |
| 2005/0048220 A1 | 3/2005 | Mertens et al. |
| 2005/0078287 A1 | 4/2005 | Sengers et al. |
| 2005/0264802 A1 | 12/2005 | Shibata et al. |
| 2006/0023185 A1 | 2/2006 | Hazelton et al. |

FOREIGN PATENT DOCUMENTS

| | | | |
|---|---|---|---|
| EP | 0605103 | | 7/1994 |
| EP | 1489462 | | 12/2004 |
| EP | 1498778 | | 1/2005 |
| EP | 1582924 | | 10/2005 |
| EP | 1612850 | | 1/2006 |
| EP | 1681597 | | 7/2006 |
| EP | 1739492 | | 1/2007 |
| JP | 62122132 | | 6/1987 |
| JP | 63157419 | | 6/1988 |
| JP | 1-171762 | * | 7/1989 |
| JP | 1-283930 | * | 11/1989 |
| JP | 5-291400 | * | 11/1993 |
| JP | 7-302827 | * | 11/1995 |
| JP | 10-216055 | | 8/1998 |
| JP | 10-223740 | * | 8/1998 |
| JP | 10-294261 | * | 11/1998 |
| JP | 2000-150627 | * | 5/2000 |
| JP | 573040 | | 1/2007 |
| KR | 2003056808 | * | 7/2003 |
| WO | WO-2004090956 | | 10/2004 |

OTHER PUBLICATIONS

U.S. Appl. No. 11/432,160, filed Aug. 6, 2003, Hickman et al.
U.S. Appl. No. 11/189,236, filed Jul. 25, 2005, Benson.
U.S. Appl. No. 11/214,388, filed Aug. 29, 2005, Parekh.
U.S. Appl. No. 11/335,251, filed Jan. 18, 2006, Manning.
Chang, K., "When There Is Splish, but No Splash," 1 page, New York Times, Apr. 5, 2005.
Office Action for U.S. Appl. No. 11/432,153, Sep. 7, 2006, 6 pages.

* cited by examiner

PHOTOLITHOGRAPHIC STEPPER AND/OR SCANNER MACHINES INCLUDING CLEANING DEVICES AND METHODS OF CLEANING PHOTOLITHOGRAPHIC STEPPER AND/OR SCANNER MACHINES

TECHNICAL FIELD

The present invention is related to stepper and/or scanner machines patterning features on microfeature workpieces. More particularly, the invention is directed to stepper and/or scanner machines including cleaning devices and methods of cleaning stepper and/or scanner machines.

BACKGROUND

Photolithography is one of the primary processes used in the manufacture of microelectronic devices (e.g., dies) on semiconductor wafers or micromechanical devices. In photolithography, a stepper or scanner machine exposes photosensitive materials to pattern the design of the features onto the semiconductor wafer's surface. A conventional stepper or scanner machine includes a wafer chuck, an illuminator to project light or other radiation, a lens to focus the light, and a reticle. The reticle can be a glass plate with a layer of chrome having a pattern corresponding to the layout of features that are to be constructed on the wafer. In a typical photolithography process, a wafer having a layer of photoresist material is positioned under the lens in the stepper or scanner machine. Next, the illuminator projects a pattern of light onto a portion of the wafer through the corresponding pattern on the reticle and the lens. The light changes the material characteristic of the exposed areas of the photoresist layer to make the exposed areas more or less susceptible to a developing solution. The stepper or scanner machine then positions another portion of the wafer under the reticle and repeats the exposure operation until the entire wafer has been patterned.

In a subsequent operation, the photoresist layer is typically baked and then developed to create the desired pattern in the resist layer for forming the features. Accordingly, the pattern must be formed in the proper location on the photoresist layer and with very precise dimensions to form very small features of 0.11 μm or less. Errors in photolithography can cause many problems including distorted patterns, misplaced patterns, and other defects. These types of errors can ultimately result in defective microelectronic devices. Moreover, as the feature sizes decrease, slight imperfections or misalignments can result in defects.

A common cause of errors in photolithography is contamination of the wafer chuck in the stepper or scanner machine. More specifically, particles or other contaminants from other processes, such as chemical-mechanical planarization, vapor depositions, etc., may remain on the wafer as it is loaded into the stepper or scanner machine. These contaminants can be left on the support surface of the wafer chuck, which prevents subsequent wafers from being properly positioned in the wafer chuck. For example, FIG. 1 is a schematic side cross-sectional view of a wafer 20, a wafer chuck 50, and a particle P between the wafer 20 and the wafer chuck 50 (shown exaggerated for illustrative purposes). The wafer chuck 50 includes a plurality of holes 54 coupled to a vacuum pump 58 to hold the wafer 20 against the chuck 50. The particle P causes the wafer 20 to deform as the vacuum pump 58 draws the wafer 20 against the chuck 50. This portion of the wafer 20, for example, can project outward from the wafer chuck 50 a distance T. As the feature sizes decrease, even a very small deformation of the wafer 20 may be greater than the field depth of the lens such that the lens may not properly focus the pattern of light on the area of the wafer 20 over the particle P. Improper focusing on a region of the wafer causes what is known as a focus spot. If focus spots are detected at a consistent location on several wafers, the wafer chuck is likely contaminated and must be cleaned.

One problem with existing stepper and scanner machines is that accessing the wafer chuck for cleaning is difficult and the stepper and scanner machines must be recalibrated after each cleaning. More specifically, the cleaning process includes shutting down the stepper or scanner machine, removing one or more panels of the housing, sliding the wafer chuck out of the housing, and cleaning the chuck manually. After the wafer chuck is manually cleaned, the chuck is repositioned in the stepper or scanner machine and the panels are reattached. However, before the stepper or scanner machine can continue processing wafers, it must be recalibrated. Recalibrating stepper and scanner machines is a difficult and time-consuming process that may also require processing target wafers to ensure the stepper or scanner machine is properly registered. The entire process requires significant downtime and consequently causes a significant reduction in throughput. Accordingly, there exists a need to reduce the downtime required to clean the stepper and/or scanner machine.

DETAILED DESCRIPTION

A. Overview

Figure 1:
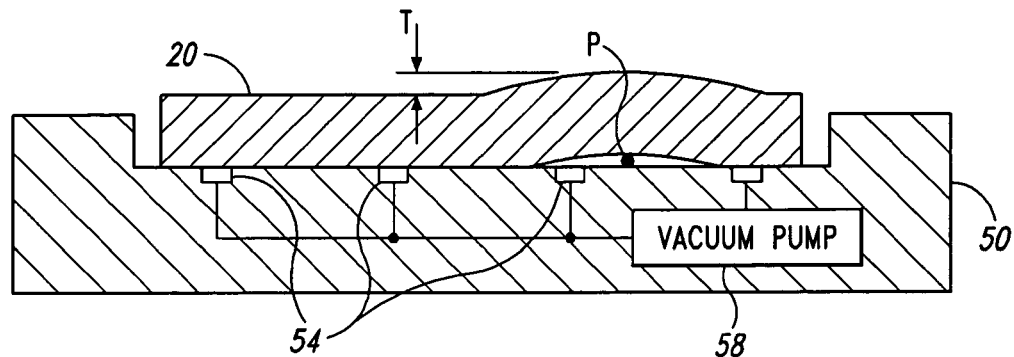
FIG. 1 is a schematic side cross-sectional view of a wafer in a contaminated wafer chuck.

The present invention is directed toward stepper and/or scanner machines for processing microfeature workpieces and methods of cleaning stepper and/or scanner machines. The term "microfeature workpiece" is used throughout to include substrates in or on which microelectronic devices, micromechanical devices, data storage elements, and other features are fabricated. For example, microfeature workpieces can be semiconductor wafers, glass substrates, insulated substrates, or many other types of substrates. Several specific details of the invention are set forth in the following description and in FIGS. 2-5 to provide a thorough understanding of certain embodiments of the invention. One skilled in the art, however, will understand that the present invention may have additional embodiments, or that other embodiments of the invention may be practiced without several of the specific features explained in the following description.

One aspect of the invention is directed to stepper or scanner machines for processing microfeature workpieces. In one embodiment, a stepper or scanner machine includes a housing, an illuminator, a lens, a workpiece support, a cleaning device for removing contaminants from the workpiece support, and a stage carrying the workpiece support. The stage and/or cleaning device is movable to selectively position the workpiece support proximate to the cleaning device. In one aspect of this embodiment, the stepper or scanner machine further includes a positioning device coupled to the cleaning device to move the cleaning device relative to the housing. Alternatively, the cleaning device may be fixed relative to the housing. In another aspect of this embodiment, the stepper or scanner machine further includes a vacuum pump operably coupled to the cleaning device to draw contaminants from the workpiece support. The stepper or scanner machine can also include a cleaning fluid supply operably coupled to the cleaning device to provide a cleaning fluid to the workpiece support.

In another embodiment, a stepper or scanner machine includes a photolithographic exposure system, a workpiece support, an internal cleaning device, and a stage carrying the workpiece support. The workpiece support has a recess to receive a microfeature workpiece, and the internal cleaning device has a distal portion with a passageway for removing contaminants from the recess of the workpiece support. The stage and/or cleaning device is movable to position the distal portion of the cleaning device at least proximate to the recess of the workpiece support. In one aspect of this embodiment, the distal portion of the cleaning device includes an end effector configured to engage the workpiece support to remove contaminants.

Another aspect of the invention is directed to methods of cleaning stepper and/or scanner machines. In one embodiment, a method includes positioning a cleaning device at least proximate to a workpiece support without removing a portion of a housing of the stepper or scanner machine. The workpiece support and the cleaning device are disposed within the stepper or scanner machine. The method further includes removing contaminants from the workpiece support with the cleaning device. In one aspect of this embodiment, removing contaminants from the workpiece support can include engaging the workpiece support with an end effector. In another aspect of this embodiment, removing contaminants from the workpiece support includes drawing contaminants from the workpiece support through a passageway in the cleaning device with a vacuum pump. In another aspect of this embodiment, the method further includes providing a cleaning fluid to the workpiece support through a first passageway in the cleaning device and exhausting the cleaning fluid from the workpiece support through a second passageway in the cleaning device.

B. Embodiments of Stepper and/or Scanner Machines

Figure 2:
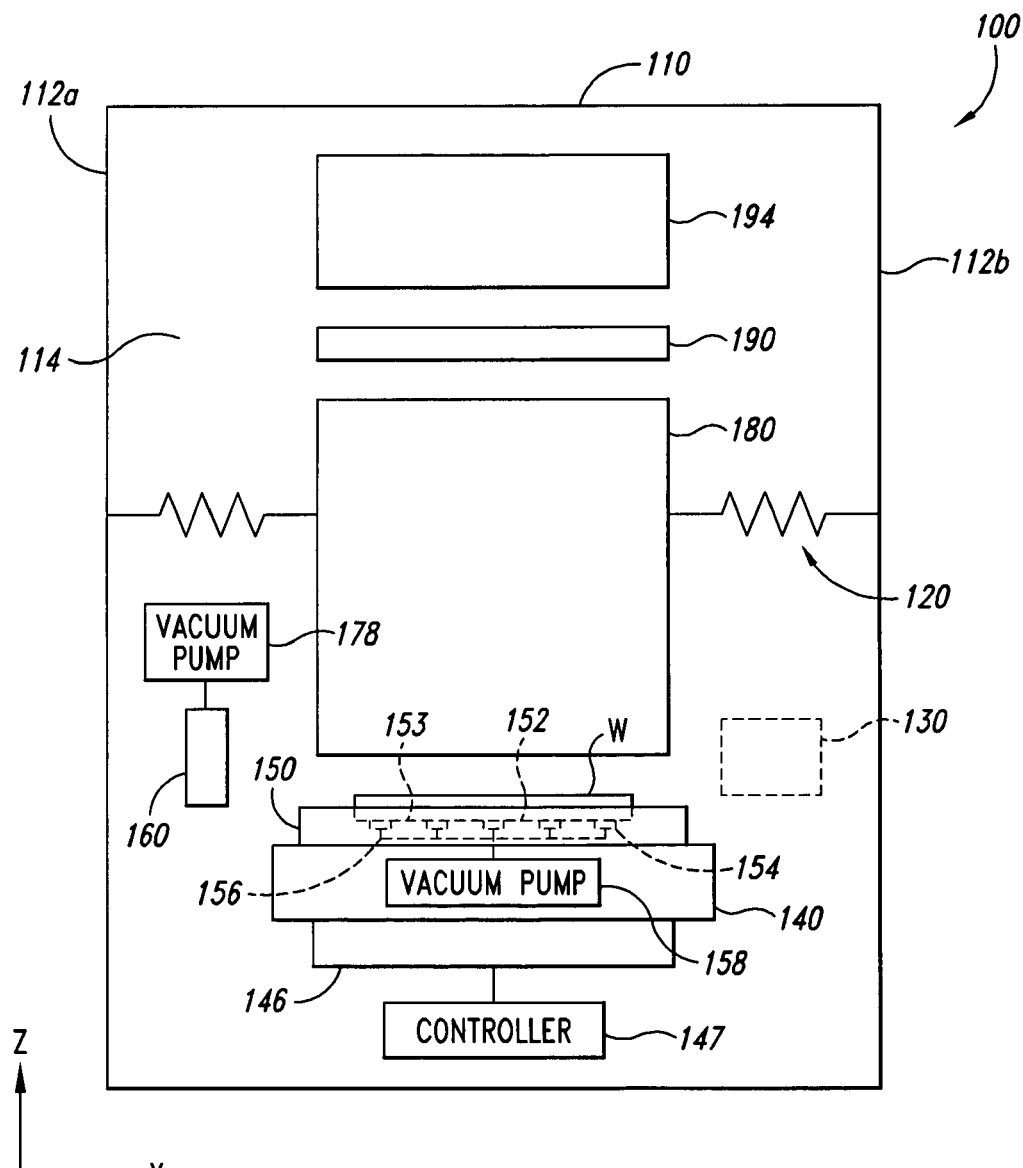
FIG. 2 is a schematic side view of a stepper or scanner machine including a cleaning device in accordance with one embodiment of the invention.

FIG. 2 is a schematic side view of a stepper or scanner machine 100 for patterning a photoresist layer on a microfeature workpiece W using a photolithography process in accordance with one embodiment of the invention. The patterns are used in the construction of microelectronic devices, micromechanical devices, and/or other features on the microfeature workpiece W. In the illustrated embodiment, the stepper or scanner machine 100 includes a housing 110 enclosing a workpiece support 150, a lens 180, a reticle 190, and an illuminator 194. The housing 110 can include a plurality of panels 112 (two of which are identified individually as 112a-b) that define an internal chamber 114. The panels 112 can be removed to access the internal components of the stepper or scanner machine 100. The temperature, humidity, and other environmental factors in the internal chamber 114 can be precisely controlled to consistently process microfeature workpieces under optimal conditions.

The workpiece support 150 carries the microfeature workpiece W during the patterning process. The workpiece support 150 can include a recess 152 defined in part by a support surface 153 to receive the microfeature workpiece W. In one embodiment, the workpiece support 150 further includes a plurality of holes 154 in the support surface 153 and a vacuum line 156 connected to the holes 154. A vacuum pump 158 (shown schematically) can be coupled to the vacuum line 156 to secure the microfeature workpiece W to the workpiece support 150 during patterning. In other embodiments, the workpiece support 150 may not include a recess, and/or the microfeature workpiece W may be secured to the workpiece support 150 by a device other than a vacuum pump.

The reticle 190 carries the patterns to be used in constructing the microelectronic devices, micromechanical devices, and/or other features on the microfeature workpiece W. For example, the reticle 190 can include a glass plate and a layer of chrome patterned on the plate. The lens 180 focuses the light pattern onto the workpiece W. In operation, the illuminator 194 projects light through the reticle 190 and the lens 180 to change the characteristics of areas of the photoresist layer exposed to the light. The exposed areas become more or less susceptible to removal in a developing solution. The illuminator 194 can project ultraviolet light or other types of electromagnetic radiation. Because the light must strike precise locations of the photoresist layer on the microfeature workpiece W, the stepper or scanner machine 100 can also include a vibration isolation system 120 to reduce alignment and focusing errors from vibration of the components within the housing 110.

The stepper or scanner machine 100 further includes a stage 140 to carry the workpiece support 150, a positioning device 146 operably coupled to the stage 140, and a controller 147 (shown schematically) to operate the positioning device 146. The controller 147 can include a computer-readable medium that operates the positioning device 146 to move the stage 140 and properly align the microfeature workpiece W relative to the lens 180. The microfeature workpiece W is properly aligned before exposure to the light so that the pattern is formed at the desired location on the workpiece W. The positioning device 146 can move the stage 140 along three orthogonal axes such as side to side (X direction), forward and backward (Y direction), and/or upward and downward (Z direction). The positioning device 146 may also rotate the stage 140 about each of the axes. The stepper or scanner machine 100 can also include a transfer mechanism 130 (shown schematically in broken lines) to load the microfeature workpiece W onto the workpiece support 150.

The stepper or scanner machine 100 further includes a cleaning device 160 disposed within the housing 110 and a vacuum pump 178 (shown schematically) operably coupled to the cleaning device 160. In one aspect of the illustrated embodiment, the cleaning device 160 removes contaminants from the workpiece support 150 so that the microfeature workpiece W can be properly positioned on the support 150. As described above, the incoming workpieces can deposit residual contaminants, such as small particles, on the workpiece support 150. The cleaning device 160 of the illustrated embodiment automatically removes contaminants from the workpiece support 150 without manual ingress into the chamber 114. The cleaning device 160 can accordingly prevent focus spots on the microfeature workpiece W as described below with reference to FIG. 3 without the downtime normally associated with manually cleaning the workpiece support 150.

In one aspect of the embodiment, the cleaning device 160 is attached at a fixed position within the housing 110. Accordingly, the controller 147 moves the stage 140 to position a portion of the cleaning device 160 in the recess 152 to remove contaminants from the workpiece support 150. In other embodiments, such as the embodiment described below with reference to FIG. 5, the cleaning device can be movable within the housing 110 and accordingly move toward the workpiece support 150. In the illustrated embodiment, the cleaning device 160 is shown positioned proximate to the lens 180; however, the cleaning device 160 can be positioned proximate to other components within the housing 110.

C. Embodiments of Cleaning Devices

Figure 3:
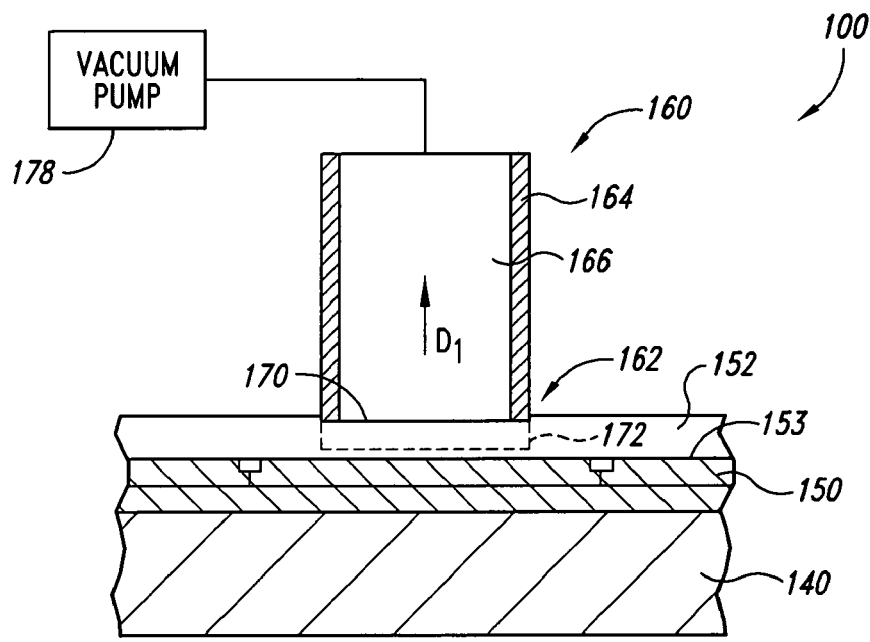
FIG. 3 is a schematic side cross-sectional view of a portion of the stepper or scanner machine and the cleaning device of FIG. 2.

FIG. 3 is a schematic side cross-sectional view of a portion of the stepper or scanner machine 100 and the cleaning device 160 of FIG. 2. In the illustrated embodiment, the cleaning device 160 includes a body 164 having a passageway 166 coupled to the vacuum pump 178 and a distal portion 162 with a lower surface 170. After the microfeature workpiece W (FIG. 2) is removed from the workpiece support 150, the stage 140 can move the workpiece support 150 so that the distal portion 162 of the cleaning device 160 is received at least partially in the recess 152. The surface 153 of the workpiece support 150 can be spaced apart from the lower surface 170 of the distal portion 162 to avoid damaging the cleaning device 160 or the workpiece support 150 during cleaning. Once the distal portion 162 is received in the recess 152, the stage 140 can move the workpiece support 150 so that the cleaning device 160 sweeps back and forth across the recess 152 to remove the contaminants. As the distal portion 162 moves over the contaminants, the vacuum pump 178 draws the contaminants from the recess 152 through the passageway 166 in a direction $D_1$. This cleaning process can occur at periodic intervals, or whenever focus spots are detected on the workpieces.

In one aspect of this embodiment, the cleaning device 160 includes an end effector 172 (shown in broken lines) attached to the distal portion 162. The end effector 172 engages the surface 153 of the workpiece support 150 to dislodge contaminants. The end effector 172 can include a brush with bristles, a pad, and/or another device depending on the type of contaminants and the material of the workpiece support 150. For example, in one embodiment, the end effector 172 can include Teflon® brushes. The end effector 172 can include a plurality of apertures or openings to allow the vacuum pump 178 to draw contaminants through the end effector 172 and into the passageway 166. In one embodiment, the stage 140 and workpiece support 150 can reciprocate back and forth so that the end effector 172 can scrub and dislodge trapped or attached contaminants. In other embodiments, the cleaning device 160 may not include an end effector.

One feature of the stepper or scanner machine in the embodiment illustrated in FIGS. 2 and 3 is that the cleaning device is disposed within the housing. An advantage of this feature is that the side panels of the housing do not need to be removed to access and clean the workpiece support. This is an improvement over prior art stepper and scanner machines that do not have an internal cleaning device. The prior art stepper and scanner machines require significant downtime to remove the workpiece support, manually clean the workpiece support, and recalibrate the stepper or scanner machine. In the illustrated embodiment, the housing panels and workpiece support do not need to be removed, and the cleaning device 160 can be quickly positioned to clean the workpiece holder 150 by merely moving the stage 140 within its normal operating range. This not only reduces the time and effort to clean the workpiece support compared to manual cleaning processes, but it also reduces or eliminates the need to recalibrate the stepper or scanner machine. Consequently, the downtime required to clean the stepper or scanner machine is reduced and the throughput of the stepper or scanner machine is increased compared to conventional manual cleaning processes.

Figure 4:
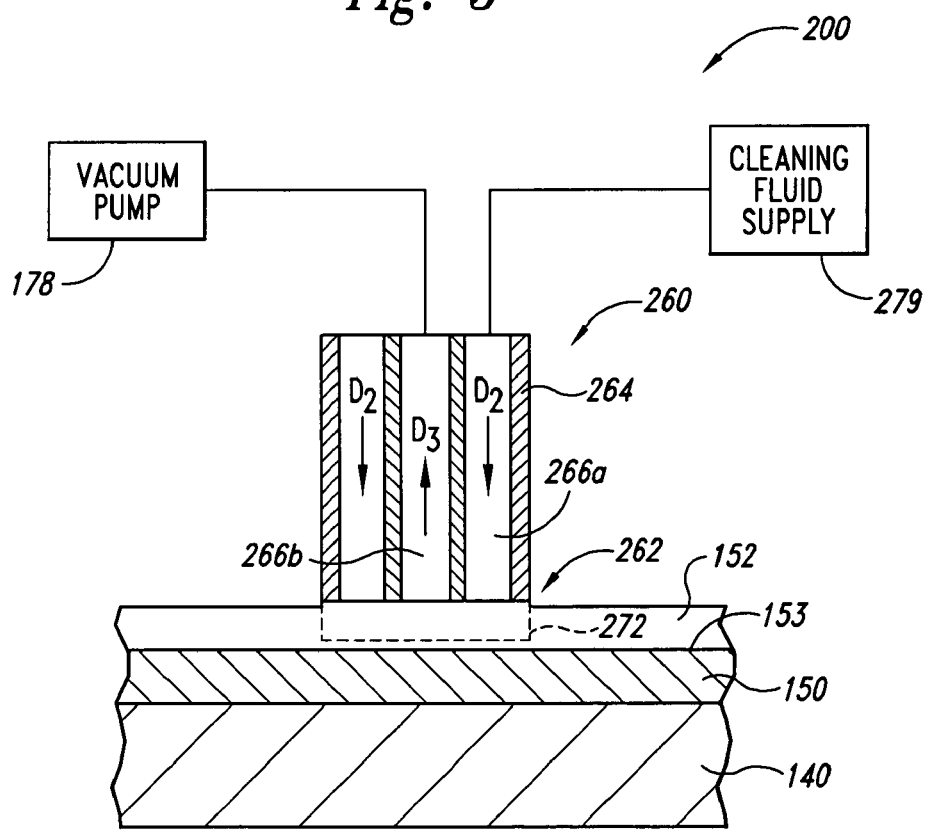
FIG. 4 is a schematic side cross-sectional view of a portion of a stepper or scanner machine including a cleaning device in accordance with another embodiment of the invention.

FIG. 4 is a schematic side cross-sectional view of a portion of a stepper or scanner machine 200 including a cleaning device 260 in accordance with another embodiment of the invention. The stepper or scanner machine 200 is generally similar to the stepper or scanner machine 100 described above with reference to FIGS. 2 and 3. For example, the stepper or scanner machine 200 includes a stage 140, a workpiece support 150, and a cleaning device 260. The cleaning device 260 includes a body 264 having a first passageway 266a, a second passageway 266b, and a distal portion 262. In the illustrated embodiment, the first and second passageways 266a-b are configured in a concentric arrangement with the first passageway 266a surrounding the second passageway 266b; however, in other embodiments, the passageways can have other configurations.

The stepper or scanner machine 200 can further include a cleaning fluid supply 279 coupled to the first passageway 266a to provide a cleaning fluid to the surface 153 of the recess 152 for removing contaminants. The cleaning fluid can include deionized water, acetone, etchants, or any other suitable fluid to remove contaminants from the recess 152. The stepper or scanner machine 200 can further include a vacuum pump 178 coupled to the second passageway 266b to remove the cleaning fluid and the contaminants from the surface 153 of the recess 152. The cleaning fluid accordingly flows in a direction $D_2$ through the first passageway 266a to the recess 152 and is exhausted in a direction $D_3$ through the second passageway 266b. The cleaning device 260 can also include an end effector 272 (shown in broken lines) similar to the end effector 172 described above with reference to FIG. 3. In other embodiments, the cleaning device can have other configurations.

D. Additional Embodiments of Stepper and/or Scanner Machines

Figure 5:
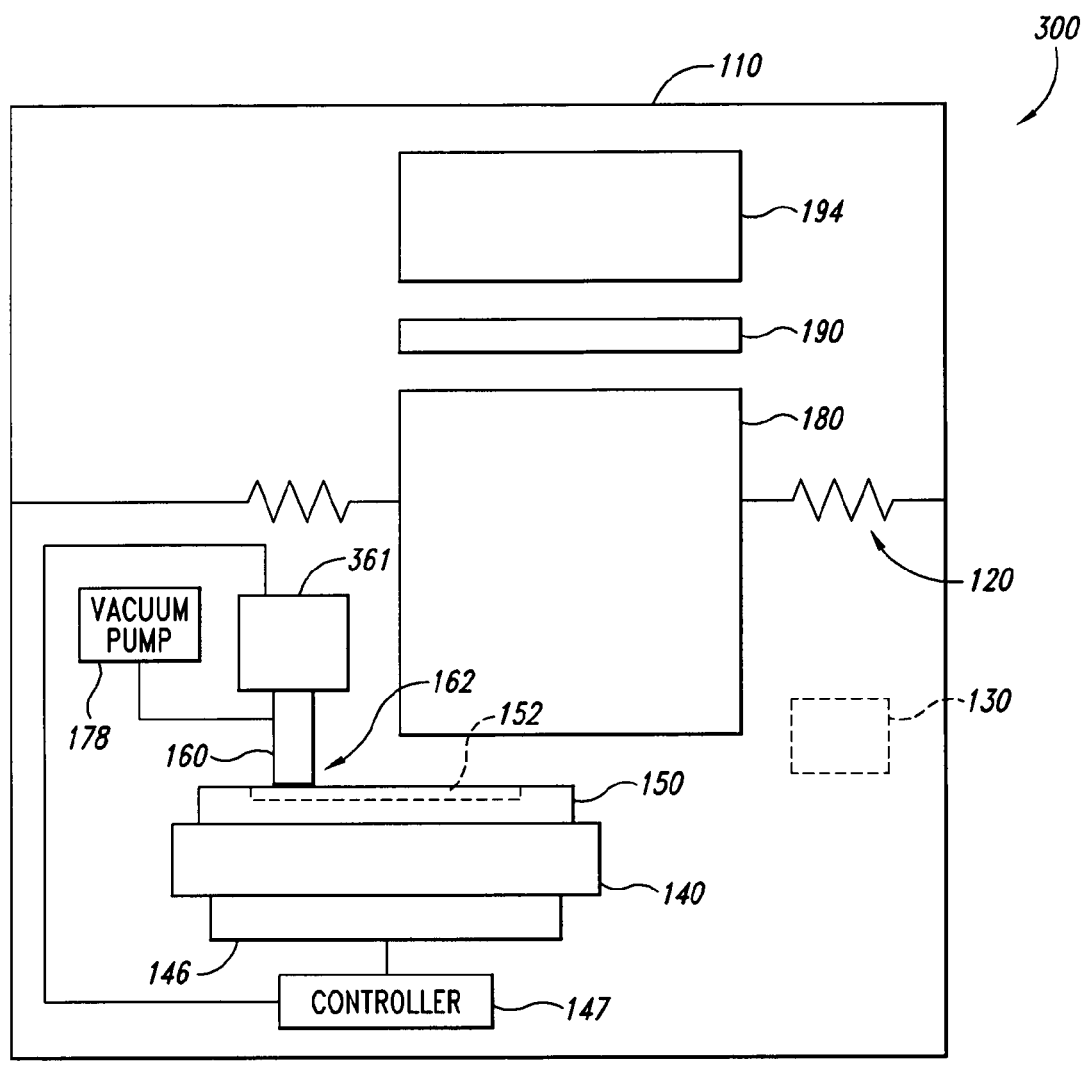
FIG. 5 is a schematic side view of a stepper or scanner machine including a cleaning device in accordance with another embodiment of the invention.

FIG. 5 is a schematic side view of a stepper or scanner machine 300 for processing microfeature workpieces in accordance with another embodiment of the invention. The stepper or scanner machine 300 can be generally similar to the stepper or scanner machine 100 described above with reference to FIGS. 2 and 3. For example, the stepper or scanner machine 300 includes a housing 110 enclosing a stage 140, a workpiece support 150, a lens 180, a reticle 190, and an illuminator 194. The stepper or scanner machine 300 further includes a controller 147, a cleaning device 160 and a positioning device 361 operably coupled to the controller 147 and the cleaning device 160. The controller 147 can operate the positioning device 361 to move the cleaning device 160 along the X, Y, and/or Z axes to position the distal portion 162 of the cleaning device 160 in the recess 152 of the workpiece support 150. Moreover, the controller 147 can operate the positioning device 361 to sweep the cleaning device 160 back and forth across the recess 152 to remove contaminants from the workpiece support 150 in a cleaning cycle. Accordingly, after the transfer mechanism 130 removes the microfeature workpiece from the workpiece support 150, the stage 140 moves the workpiece support 150 along the X axis toward the cleaning device 160. Once the stage 140 has moved the workpiece support 150 proximate to the cleaning device 160, the positioning device 361 moves the cleaning device 160 to remove contaminants from the recess 152. In other embodiments, the positioning device may not move the cleaning device along the X, Y, and Z axes. For example, the positioning device may only move the cleaning device along the Z axis.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A stepper or scanner machine for processing microfeature workpieces, the machine comprising:
   a housing;
   an illuminator disposed within the housing;
   a lens disposed within the housing;
   a workpiece support disposed within the housing;
   a cleaning device, a cleaning fluid supply having a liquid-phase cleaning fluid, and a vacuum pump all disposed within the housing to remove contaminants from the workpiece support, the cleaning device being operably coupled to the vacuum pump, in fluid communication with the cleaning fluid supply, and configured to deliver the liquid-phase cleaning fluid to the workpiece support; and
   a stage carrying the workpiece support, at least one of the stage and the cleaning device being movable relative to the other to selectively position the workpiece support at least proximate to the cleaning device.

2. The machine of claim 1 wherein the cleaning device comprises an end effector configured to engage the workpiece support to remove contaminants.

3. The machine of claim 1, further comprising a positioning device coupled to the cleaning device to move the cleaning device relative to the housing.

4. The machine of claim 1, further comprising a cleaning fluid supply;
   wherein the cleaning device comprises a first passageway in fluid communication with the cleaning fluid supply to provide the liquid-phase cleaning fluid to the workpiece support and a second passageway to exhaust the liquid phase cleaning fluid from the workpiece support.

5. The machine of claim 1, wherein:
   the workpiece support comprises a recess to receive a microfeature workpiece; and
   the cleaning device comprises a distal portion positionable at least partially in the recess to remove contaminants from the recess.

6. The machine of claim 1, further comprising a controller operably coupled to the stage and having a computer-readable medium containing instructions to perform a method comprising positioning the workpiece support under the cleaning device.

7. The machine of claim 1, further comprising a controller operably coupled to the cleaning device and having a computer-readable medium containing instructions to perform a method comprising moving the cleaning device relative to the housing.

8. The machine of claim 1, further comprising a controller operably coupled to the stage and the cleaning device, the controller having a computer-readable medium containing instructions to perform a method comprising moving the cleaning device and the stage to position the cleaning device at least proximate to the workpiece support.

9. A stepper or scanner machine for processing microfeature workpieces, the machine comprising:
   a housing;
   an illuminator disposed within the housing;
   a lens disposed within the housing;
   a workpiece support disposed within the housing;
   a cleaning fluid supply having a liquid-phase cleaning fluid;
   a cleaning device in fluid communication with the cleaning fluid supply and disposed within the housing to remove contaminants from the workpiece support; and
   a stage carrying the workpiece support, at least one of the stage and the cleaning device being movable relative to the other to selectively position the workpiece support at least proximate to the cleaning device;
   wherein the cleaning device is fixed relative to the housing.

10. The machine of claim 1 wherein the vacuum pump is configured to draw the contaminants from the workpiece support.

11. A stepper or scanner machine for processing microfeature workpieces, the machine comprising:
    a photolithographic exposure system;
    a workpiece support having a recess to receive a microfeature workpiece, the workpiece support being positionable at least proximate to the photolithographic exposure system;
    a cleaning fluid supply having a liquid-phase cleaning fluid;
    an internal cleaning device having a distal portion with a first passageway in fluid communication with the cleaning fluid supply to provide the liquid-phase cleaning fluid to the workpiece support and a second passageway to exhaust the liquid-phase cleaning fluid from the workpiece support; and
    a stage carrying the workpiece support, at least one of the stage and the cleaning device being movable relative to the other to position the distal portion of the cleaning device at least proximate to the recess of the workpiece support.

12. The machine of claim 11, further comprising a housing enclosing the internal cleaning device, the workpiece support, and the stage.

13. The machine of claim 11 wherein the distal portion of the cleaning device comprises an end effector configured to engage the workpiece support.

14. The machine of claim 11, further comprising:
    a housing enclosing the workpiece support, the stage, and the internal cleaning device; and
    a positioning device coupled to the cleaning device to move the cleaning device relative to the housing.

15. The machine of claim 11, further comprising a vacuum pump operably coupled to the second passageway of the cleaning device to draw contaminants from the recess of the workpiece support and a housing enclosing the internal cleaning device, the workpiece support, the vacuum pump, and the stage.

16. The machine of claim 11 wherein the first and second passageways are in a generally concentric arrangement.

17. The machine of claim 11 wherein the first and second passageways are in a generally concentric arrangement with the first passageway surrounding the second passageway.

18. A stepper or scanner machine for processing microfeature workpieces, the machine comprising:
   a photolithographic exposure system;
   a workpiece support having a recess to receive a microfeature workpiece, the workpiece support being positionable at least proximate to the photolithographic exposure system;
   a cleaning fluid supply having a liquid-phase cleaning fluid;
   an internal cleaning device in fluid communication with the cleaning fluid supply and having a distal portion with a passageway for removing contaminants from the recess of the workpiece support;
   a stage carrying the workpiece support, at least one of the stage and the cleaning device being movable relative to the other to position the distal portion of the cleaning device at least proximate to the recess of the workpiece support; and
   a housing enclosing the workpiece support, the stage, and the internal cleaning device, wherein the cleaning device is fixed relative to the housing.

19. A stepper or scanner machine for processing microfeature workpieces, the machine comprising:
   a housing;
   a photolithographic system disposed within the housing for patterning a layer of resist on a microfeature workpiece;
   a workpiece support within the housing, the workpiece support having a recess to receive the microfeature workpiece;
   a cleaning fluid supply having a liquid-phase cleaning fluid;
   a means for removing contaminants from the recess of the workpiece support, the means for removing contaminants being in fluid communication with the cleaning fluid supply and disposed within the housing; and
   a stage carrying the workpiece support, the stage being movable relative to the means for removing contaminants to selectively position the workpiece support at least proximate to the means for removing contaminants.

20. The machine of claim 19 wherein the means for removing contaminants comprises an end effector configured to engage the workpiece support to remove contaminants.

21. The machine of claim 19 wherein:
   the means for removing contaminants comprises a distal portion with a passageway; and
   the machine further comprises a vacuum pump operably coupled to the passageway to draw contaminants from the workpiece support.

22. The machine of claim 19, further comprising a cleaning fluid supply;
   wherein the means for removing contaminants comprises a first passageway in fluid communication with the cleaning fluid supply to provide the liquid-phase cleaning fluid to the workpiece support and a second passageway to exhaust the liquid-phase cleaning fluid from the workpiece support.

* * * * *